United States Patent
Srivastava et al.

(10) Patent No.: US 6,293,457 B1
(45) Date of Patent: Sep. 25, 2001

(54) INTEGRATED METHOD FOR ETCHING OF BLM TITANIUM-TUNGSTEN ALLOYS FOR CMOS DEVICES WITH COPPER METALLIZATION

(75) Inventors: Kamalesh K. Srivastava, Wappingers Falls; Jonathan H. Griffith, Poughkeepsie; Mary C. Cullinan-Scholl, Hopewell Junction; William H. Brearley, Poughkeepsie; Peter C. Wade, Hyde Park, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/590,119

(22) Filed: Jun. 8, 2000

(51) Int. Cl.⁷ ............................ B23K 31/02; B23K 31/10
(52) U.S. Cl. ...................................... 228/254; 228/180.22
(58) Field of Search ............................... 228/254, 180.22, 228/180.21, 245, 248.1; 438/612, 613, 614; 156/345; 216/13, 51, 77, 78; 257/737, 738

(56) References Cited

U.S. PATENT DOCUMENTS

| | | |
|---|---|---|
| 4,582,745 * | 4/1986 | Schnable . |
| 5,137,845 * | 8/1992 | Lochon et al. . |
| 5,268,072 * | 12/1993 | Agarwala et al. . |
| 5,418,186 * | 5/1995 | Park et al. . |
| 5,445,705 | 8/1995 | Barbee et al. ........................ 156/627.1 |
| 5,456,788 | 10/1995 | Barbee et al. ........................ 156/345 |
| 5,462,638 | 10/1995 | Datta et al. ........................ 156/656.1 |
| 5,543,032 * | 8/1996 | Datta et al. . |
| 5,629,564 * | 5/1997 | Nye, III et al. . |
| 5,705,428 | 1/1998 | Liu et al. ........................ 437/192 |
| 5,767,010 * | 6/1998 | Mis et al. . |
| 5,775,569 * | 7/1998 | Berger et al. . |
| 5,902,686 * | 5/1999 | Mis . |
| 5,937,320 | 8/1999 | Andriacos et al. ................... 438/614 |
| 5,946,590 * | 8/1999 | Satoh . |
| 6,015,505 | 1/2000 | David et al. ........................ 252/79.2 |
| 6,025,649 | 2/2000 | DiGiacomo ........................ 257/779 |
| 6,130,170 * | 10/2000 | David et al. . |

FOREIGN PATENT DOCUMENTS 01169491    6/1989  (JP) .

OTHER PUBLICATIONS

Tillack, et al. , Abstract of "Monitoring of Deposition and Dry Etching of Si/SiGe Multiple Stacks", (Feb. 1996) J. Vac. Sci. Technol. B. Microelectron Nanometer Struct. (USA) vol. 14, No. 1 Jan, pp. 102–105.

* cited by examiner

*Primary Examiner*—Tom Dunn
*Assistant Examiner*—Jonathan Johnson
(74) *Attorney, Agent, or Firm*—Ira D. Blecker; Graham S. Jones, II

(57) ABSTRACT

Form a solder connector on a semiconductor device starting with a first step of forming at least one dielectric layer over a doped semiconductor substrate. Then form a hole through the dielectric layer down to the semiconductor substrate. Form a metal conductor in the hole. Form intermediate layers over the metal conductor and the dielectric layer. Then form a tapered opening down to the surface of the metal conductor. Form BLM layers including a titanium-tungsten (TiW) layer over the metal conductor and the dielectric layer with the remainder of the BLM layers being formed over the TiW layer. Form a mask over the top surface of the BLM layers with a patterning through hole located above the metal conductor exposing a portion of the surface of the BLM layers. Plate a C4 solder bump on the BLM layers in the patterning hole. Remove the mask. Wet etch away the BLM layers aside from the solder bump leaving a residual TiW layer over the dielectric layer. Perform a dry etching process to remove the residual TiW layer aside from the solder bump. Then, end the dry etching when the end point has been reached. Finally, heat the solder bump in a reflow process to form a C4 solder ball.

23 Claims, 11 Drawing Sheets

INTEGRATED METHOD FOR ETCHING OF BLM TITANIUM-TUNGSTEN ALLOYS FOR CMOS DEVICES WITH COPPER METALLIZATION

BACKGROUND OF THE INVENTION

1. Field of the Invention

This invention relates to semiconductor devices and more particularly to processing of titanium-tungsten (TiW) alloys during manufacturing of connectors for semiconductor devices.

2. Description of Related Art

In the manufacture of semiconductor devices electrical and mechanical interconnections employ titanium tungsten alloys as a part of the structure which interconnects layers composed of different materials. In patterning such interconnections it may be necessary to etch away unwanted material. When chemical etchants are used there is a problem of undercutting the structures where the titanium-tungsten alloys are exposed since that can seriously reduce the quality of the interconnection structures. The problem has been encountered in connection with Controlled Collapse Chip Connection (C4) solder balls where chemical etchants have been used to remove titanium-tungsten alloys. U.S. Pat. No. 5,462,638 of Datta et al. for "Selective Etching of TiW for C4 Fabrication", which is commonly assigned, describes a "chemical etchant . . . for removing thin films of titanium-tungsten alloy in microelectronic chip fabrication." Preferably the alloy removed is 10% Ti and 90% W, which is layered onto a substrate under chromium (Cr), and copper (Cu) seed layers for electrodeposition of C4 solder bumps which are to be formed into solder balls. The chemical etchant is an aqueous solution of 30% by weight of hydrogen peroxide $H_2O_2$ and water to which are added EDTA and potassium sulfate ($K_2SO_4$) which etches TiW rapidly at temperatures between 40° C. and 60° C.

U.S. Pat. No. 5,937,320 "Barrier Layer for Electroplated SnPb Eutectic Solder Joints" of Andricacos et al., which is commonly assigned, describes use of nickel (Ni) as an electroplating barrier layer for low temperature solder and refers to a first adhesion layer of titanium-tungsten (TiW) etched by a chemical process at 60° C., as taught in Datta et al. U.S. Pat. No. 5,462,638.

Liu et al. U.S. Pat. No. 5,705,428 for "Method for Preventing Titanium Lifting During and After Metal Etching" creates several layers deposited upon a semiconductor substrate starting on a titanium (Ti) lower layer. The other layers include a titanium-tungsten (TiW) alloy layer formed on the Ti lower layer, followed by an aluminum-based (Al-based) layer with a trace of copper therein. Then a photoresist mask is formed over the Al-based layer. Thereafter, a series of Reactive Ion Etching (RIE) steps are used to "enable the transfer of the desired image to the underlying metal composite." The Al-based layer and the TiW layer are etched by RIE. Then the titanium lower layer is etched yielding titanium nitride sidewalls on the edges of the remaining portions of the titanium lower layer.

Alternatively the TiW layer is etched alone followed by stripping the photoresist with water in an oxygen ambient which forms titanium oxide sidewalls on the titanium lower layer. A third alternative is to etch the titanium in an $N_2$ ambient to create titanium nitride sidewalls followed by stripping the photoresist with $H_2O$ and $O_2$ ambient. In summary, Liu et al. focus upon forming titanium nitride or oxide to prevent lifting of the lower Ti layer by including an appropriate gas ($N_2$ or $O_2$) in the RIE process used for defining metal lines. This RIE process etches to form nearly flat stacks of Al/TiW/Ti. Use of a RIE process for patterning Al/TiW/Ti layers is a well known prior art method which has been employed before the advent of Chemical Mechanical Processing (CMP) to define conductor lines. The focus of Liu et al. is the application of such an etching process that forms a TiN or $TiO_2$ sidewall on the titanium lower layer to prevent lifting of the Ti layer.

A different kind of a process is described in Ozasa Yasuhiko Patent Abstracts of Japan: Application Number 01169491, with an application date of Jun. 29, 1989 published Feb. 14, 1991 for "Manufacture of Semiconductor Device" says, first coat a silicon nitride ($Si_3N_4$) film with a TiW film as a bonding barrier. Next sputter a gold film onto the TiW lower film. A gold layer is plated onto the gold film by selective plating. Next coat the gold layer with an upper TiW film which is thicker than the original TiW film. Then pattern the gold layer, etch away the unprotected portion of the thicker upper TiW film, with a wet etching process which is shown to remove the TiW from the sidewalls of the gold layer and the exposed top surfaces of the gold film. Remove the photoresist. Next, the gold film and the upper TiW layer are etched away in two steps shown by the drawings using magnetron type RIE device to remove the gold film, first from layer exposing the top surface of the lower TiW film. Finally the TiW layers are etched away to complete the gold wiring where exposed, but the method of etching the last etching step is not defined in the abstract. The drawings show etching down to the silicon nitride ($Si_3N_4$) film.

SUMMARY OF THE INVENTION

In accordance with this invention form a solder connector on a semiconductor device starting with a first step of forming at least one dielectric layer over a doped semiconductor substrate. Then form a hole through the dielectric layer down to the semiconductor substrate. In the hole, form a metal conductor structure composed of a metallic electrical conductor, e.g. copper or aluminum metal pad or line. Form intermediate blanket layers which may be composed of silicon dioxide, silicon nitride and polyimide. Then form blanket SLM (Solder Limiting Metallurgy) layers including a titanium-tungsten (TiW) layer formed over the metal pad and the dielectric layer with the remainder of the SLM layers being formed over the TiW layer. Form a mask over the top surface of the SLM layers with a patterning through hole located above the metal pad exposing a portion of the surface of the SLM layers. Plate a C4 solder bump on the SLM layers in the patterning hole. Remove the mask. Wet etch away the SLM layers aside from the solder bump leaving a residual TiW layer over the dielectric layer. Then continue to etch away a portion of the TiW layer in a wet etching bath. Perform a dry etching process to remove the residual TiW layer aside from the solder bump. Then end the dry etching when the end point has been reached. Then heat the solder bump in a reflow process to form a C4 solder ball.

Preferably, the SLM structure includes a copper/chrome (Cu/Cr) layer and a copper (Cu) layer stacked above the TiW layer.

Preferably, the Cu layer and the Cu/Cr layer are wet etched away by electroetching in a potassium sulfate solution. Preferably the step of wet etching of the TiW layer is performed in a wet etching solution of hydrogen peroxide ($H_2O_2$), water ($H_2O$), potassium sulfate ($K_2SO_4$), sulfuric acid ($H_2SO_4$), and EDTA (a salt of EthyleneDiamineTetraAcetic acid) continuing until only a predetermined thickness of TiW remains, at which time the wet etching of TiW is terminated by employing end point detection of the thickness of the TiW layer.

Preferably, the dry etching process comprises a RIE process.

BRIEF DESCRIPTION OF THE DRAWINGS

The foregoing and other aspects and advantages of this invention are explained and described below with reference to the accompanying drawings, in which:

FIG. 2A shows a workpiece at an early stage in the process of manufacture in accordance with the method of FIG. 1 after formation of a dielectric layer on a doped silicon substrate followed by formation of a hole in the dielectric layer down to the surface of the substrate. The hole was filled by a metal structure composed of an electrical conductor, e.g. copper or aluminum therein. The electric conductor is in contact with the surface of doped silicon substrate.

FIG. 2B shows the workpiece of FIG. 2A, after several films were formed on the top surface of the dielectric layer and the electrical conductor in FIG. 2A and after formation of a photoresist mask for etching of a flared opening comprising a connector hole down to the electrical conductor. The photoresist mask has been formed over the electrical conductor.

FIG. 2C shows the workpiece of FIG. 2B, followed by RIE etching a flared out opening in the several films which were just formed down to the conductor and after the photoresist mask has been removed.

FIG. 2D shows the workpiece of FIG. 2C, after formation of several BLM layers (i.e. a Cu layer, a Cr/Cu layer and a TiW layer), the step of formation of a mask, and the step of formation of a C4 bump on the BLM layer in an opening in the mask.

FIG. 2E shows the workpiece of FIG. 2D after removing the mask, thereby exposing the portions of the BLM layers aside from the solder bump.

FIG. 2F shows the workpiece of FIG. 2E after wet etching down through portions of the BLM layers including the Cu layer, Cr/Cu layer and most of TiW layer of the BLM in a self-aligned wet etching step.

FIG. 2G shows the workpiece of FIG. 2F after RIE etching away the residual TiW layer until an end point has been detected.

FIG. 2H shows the workpiece of FIG. 2G the solder bump was heated and changed in a reflow process to form a C4 solder ball on the fully patterned BLM thereby yielding the final product of the method of this invention.

PROBLEM SOLVED BY INVENTION

For the interconnection of semiconductor chips to packages which support an array of chips, we have found that one can employ a set of Controlled Collapse Chip Connection (C4) solder balls, each of which is connected to a Ball Limiting Metallurgy (BLM) pad. To create such BLM pads, a set of films including a Titanium-Tungsten (TiW) alloy film are deposited as blanket films by a sputtering process. C4 solder bumps may be formed by a process of plating lead-tin solder to form a Pb-Sn alloy solder bump. After forming the C4 solder bump one may etch away the BLM films including the TiW film aside from the BLM regions located directly under the C4 solder bump deposit. Thus the superfluous portions of the TiW alloy film are etched away by employing a wet etching process. We have observed that wet etching of the TiW alloy generates a vigorous effervescence action which generates tiny bubbles. The tiny bubbles stir up the boundary layer, which in turn removes the product of etching and replenishes the etching molecules. Therefore, the etching process is dependent on the C4 bump pattern. We have discovered that this etching process works very well for those patterns with narrow kerf areas, which permits adequate dwell time for the combined effervescent bubbles/ etching solution/TiW film interaction. However, in case of wafer-level designs which require wide kerf areas there is not adequate time for the combined effervescent bubbles/ etching solution/TiW film interaction process to operate effectively.

The problem we have encountered with our process is that a TiW residue remains covering the features in the kerf areas which is a serious detriment to yield quantity. These residues cannot be cleaned completely by using simply a wet-etching process without risking damage to the structure caused by over-etching of the BLM film creating an undercut of the BLM film under the edges of the C4 bump, because in the wide kerf area, there is insufficient effervescence to etch the desired areas appropriately. The problem is that the C4's suffer from serious undercutting leading to reduction of the integrity of the C4's or degradation of reliability of the product.

DESCRIPTION OF THE PREFERRED EMBODIMENT

Figure 1:
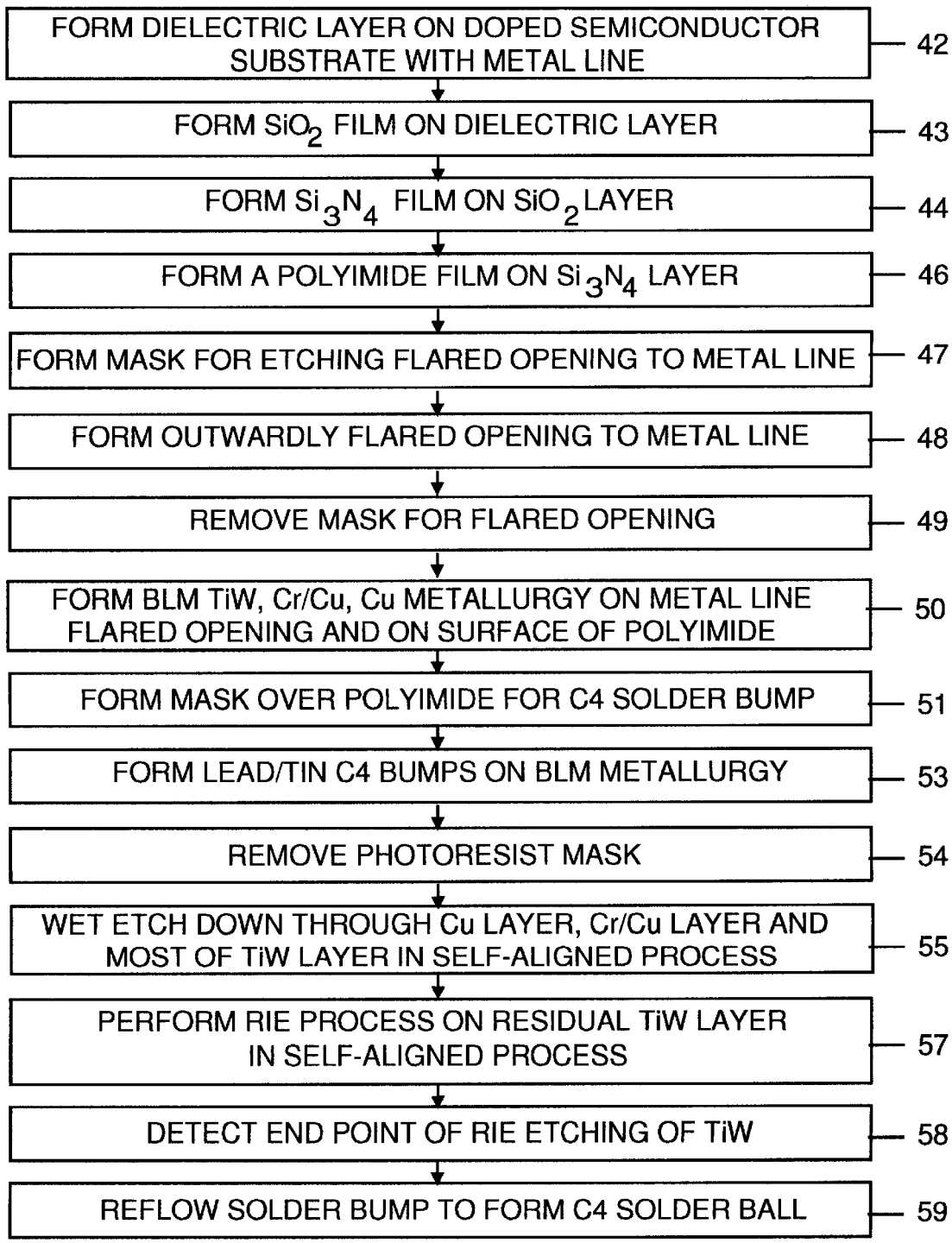
FIG. 1 is a flowchart for forming a C4 solder ball on a BLM layer formed in accordance with the method of this invention.

FIG. 1 is a flowchart of a process of forming a C4 with a BLM layer processed in accordance with the method of this invention.

Figure 2A:
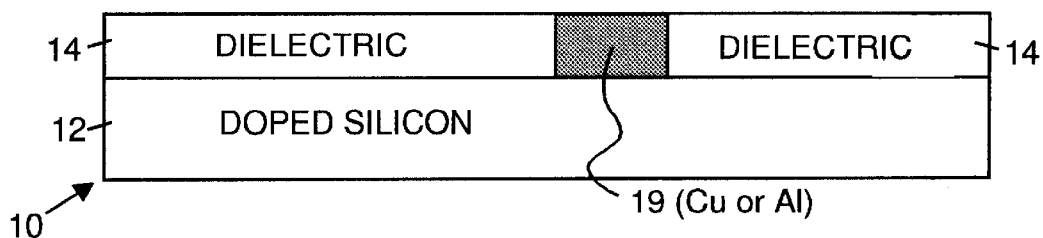
FIGS. 2A–2H are sectional views of a workpiece in the course of manufacture illustrating the process flow of the process of FIG. 1, in accordance with the method of this invention.

FIG. 2A shows a workpiece 10 in an early stage in the process of FIG. 1 for manufacture of a workpiece in accordance with the method of this invention. The process begins with a doped, planar, silicon, semiconductor substrate 12 which has been doped with a conventional P or N type dopant. During performance of step 42 of FIG. 1 a blanket dielectric layer 14 is formed on top of the doped silicon substrate 12. In accordance with processing methods well known by those skilled in the art, a mask (not shown) was formed and a hole (not shown) was etched in the dielectric layer 14 down to the surface of the substrate 12. The hole was filled by a metal conductor structure 19 composed of a metallic electrical conductor, e.g. copper or aluminum. The bottom of the metallic, electrical conductor 19 is formed on that portion of the surface of substrate 12 exposed when a hole was formed in the dielectric layer 14. Thus the metallic, electrical conductor 19 is in intimate mechanical and electrical contact with the surface of doped silicon substrate 12. Both the dielectric layer 14 and the electrical conductor 19 are formed on the top surface of the planar, doped silicon, semiconductor substrate 12. Electrical conductor 19 can be a metal line, pad or a metal VIA interconnection to another layer in a multilayer structure. The electrical conductor 19 is composed of an metal, e.g. copper or aluminum. The metal conductor structure composed of copper or aluminum in the form of metal electrical conductor 19 is preferably deposited by the process of plating followed by a CMP step to planarize the surface. The planarization step is used to match the thickness of the metallic, electrical conductor 19 and the dielectric layer 14. Alternatives to plating are sputtering or Chemical Vapor Deposition (CVD). Materials suitable for use in dielectric layer 14 include silicon dioxide, or a low-k dielectric material such as benzcyclobutene BCB) or a combination of these materials.

Figure 2B:
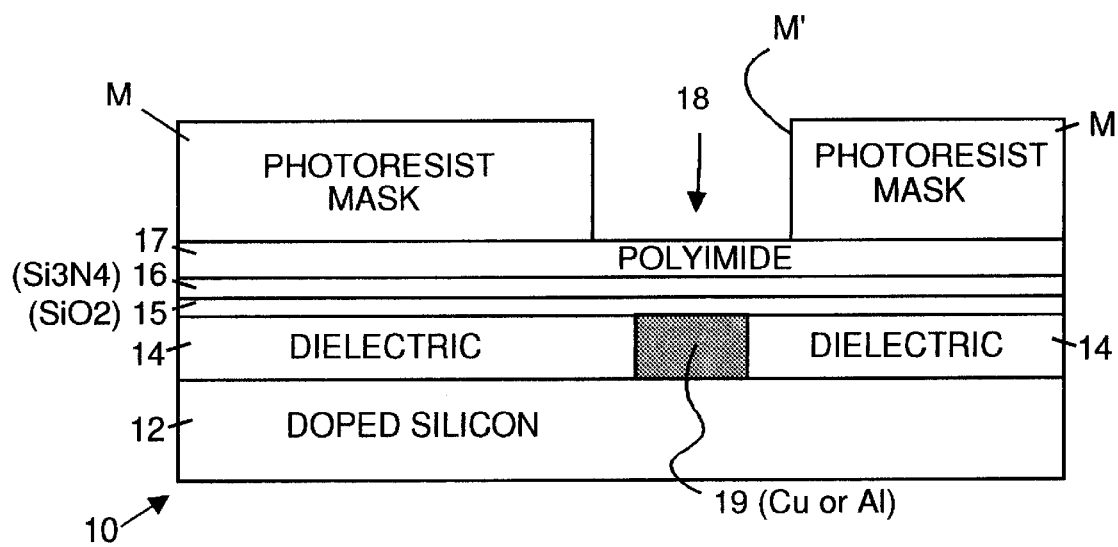

FIG. 2B shows the workpiece of FIG. 2A, after a blanket silicon dioxide ($SiO_2$) film 15 was formed on the top surface of a dielectric layer 14 in FIG. 2A followed by forming a blanket silicon nitride $Si_3N_4$ film 16 and a blanket polyimide film 17 in steps 43, 44 and 46 in FIG. 1 and after formation of a photoresist mask M for etching a flared opening comprising a connector hole 18 down to the metallic, electrical conductor 19. The photoresist mask M has been formed over polyimide layer 17 with an opening 18 over the metallic, electrical conductor 19 followed by RIE etching a flared out opening 18' in polyimide layer 17, $Si_3N_4$ film 16 and $SiO_2$ film 15 down to the metallic, electrical conductor 19. In step 43 of FIG. 1 a blanket thin silicon dioxide ($SiO_2$) film 15 is formed on the top surface of the dielectric layer 14, as seen in FIG. 2B. In step 44 of FIG. 1 a blanket thin silicon nitride ($Si_3N_4$) film 16 is formed on the top surface of the $SiO_2$ layer 15, as seen in FIG. 2B. In step 46 of FIG. 1, a blanket polyimide film 17 is formed on the top surface of the $Si_3N_4$ layer 16, as seen in FIG. 2B which also shows the result of step 47 after formation of a photoresist mask M with a hole M' for etching a flared connector hole as indicated by arrow 18. In step 48, the connector hole 18 with flared sidewalls 18' has been formed through the layers 17, 16, and 14 down to the top surface of the metal conductor line 19, according to step 47 of FIG. 1.

Figure 2C:
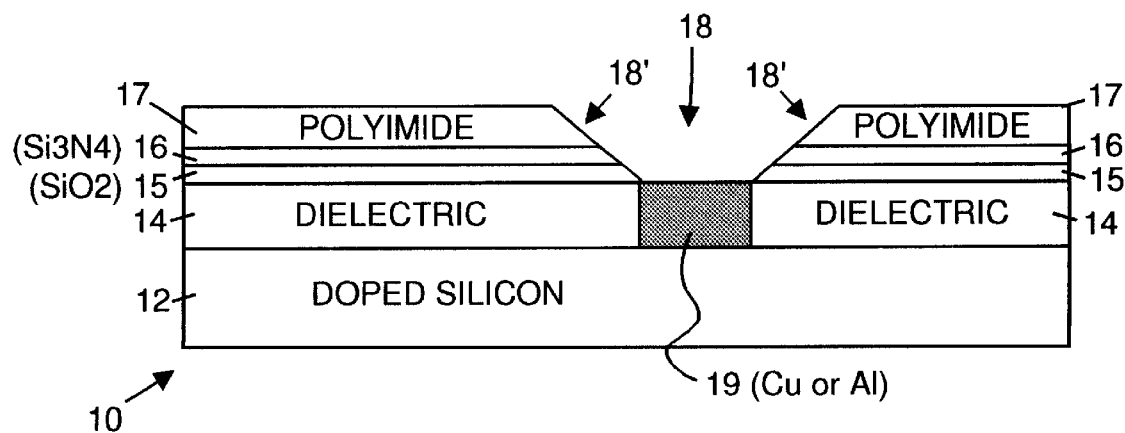

FIG. 2C shows the workpiece 10 of FIG. 2B after a connector hole 18 has been formed extending through all the layers 15, 16, 17. The connector hole 18 flares out from the bottom to the top forming flared sloping surfaces 18' of layers 15, 16 and 17 upon which the BLM will be formed in step 50. To repeat, connector hole 18 comprises a conductor pad hole 18 which is formed through the newly formed layers 15, 16 and 17 down to the surface of the metallic, electrical conductor 19, e.g. a pad or line. The connector hole 18 was formed by the process of photodefining using photoresist, exposing the photoresist through opening M' in a mask M to define a pattern. Then connector hole 18 is formed by using oxygen ($O_2$), carbon tetrafluoride ($CF_4$) and methylhydrofluoride ($CHF_3$) in combination in a reactive ion etching (RIE) process. The RIE gases pass through hole M' in mask M etching a wider opening of the lateral surfaces 18' at the top of the conductor pad hole 18 where the lateral surfaces 18' of connector hole 18 flare outwardly (i.e. laterally) from the central opening of connector hole 18, which narrows down to the top surface of metallic, electrical conductor 19 and the dielectric layer 14. In summary, the connector hole 18/18' grows successively wider in the $SiO_2$ layer 15, $Si_3N_4$ layer 16 and polyimide layer 17 from the bottom to the top, so the lateral surfaces 18' of connector hole 18 are widest in at the top surface of the polyimide layer 17.

FIG. 2C shows the workpiece 10 of FIG. 2B after step 49 in FIG. 1 of removing the mask M from the device 10 leaving the polyimide surface 17 and the opening 18/18' exposed.

Figure 2D:
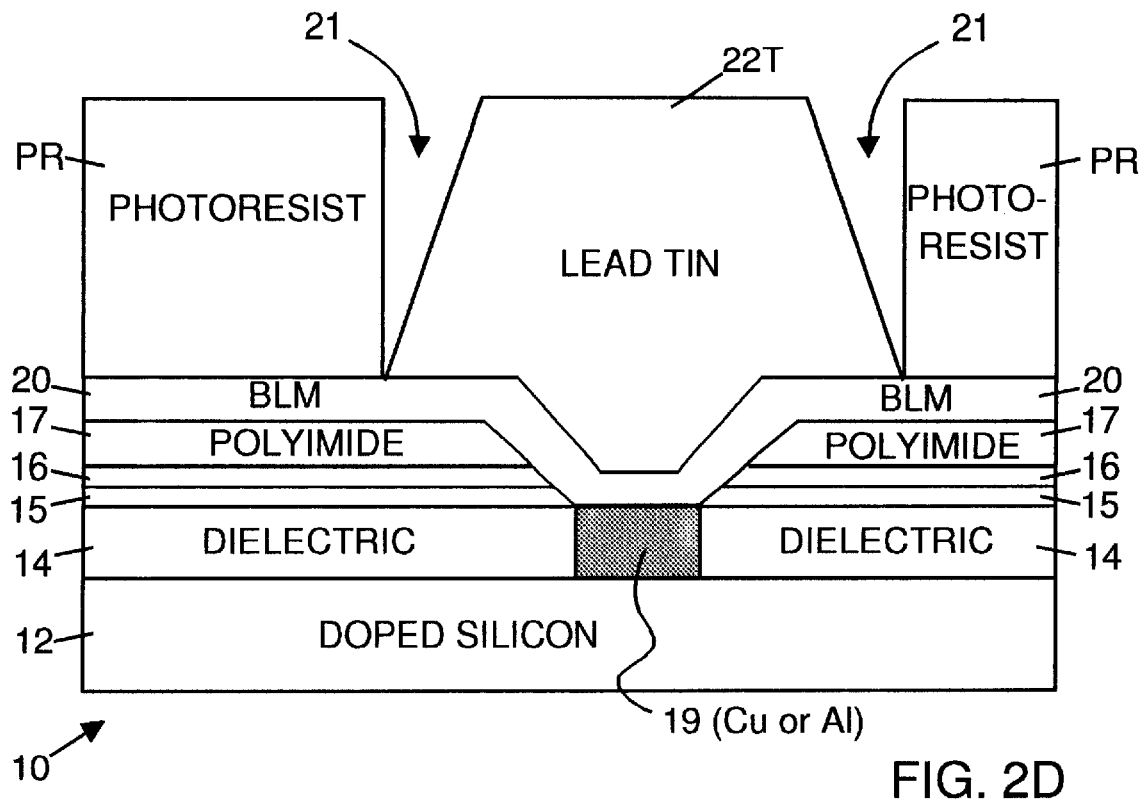

FIG. 2D shows the workpiece 10 of FIG. 2C, after three steps 50, 51 and 53 of FIG. 1 have been performed, as follows:
1) step 50—BLM formation,
2) step 51—masking, and
3) step 53—formation of a C4 bump In step 50, a sandwich of three blanket BLM metal layers 20A, 20B and 20C form BLM layers 20 (shown in FIG. 3A) are deposited over metallic, electrical conductor 19, over lateral surfaces 18' of adjacent layers and over polyimide layer 17. The BLM metal layers 20 are formed on the top surface of metallic, electrical conductor 19, over the lateral surfaces 18' of connector hole 18 and above polyimide layer 17 before formation of the solder bump 22T.

Figure 3A:
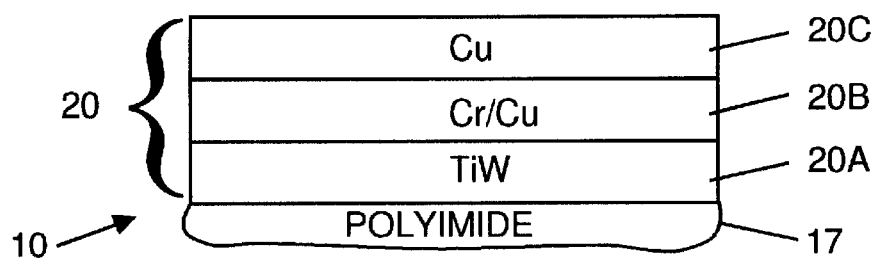
FIG. 3A is a section along line 3A–3A' in FIG. 2E, which shows an enlarged cross-sectional schematic diagram of the BLM layers.

Referring to FIG. 3A, which is a section along line 3A–3A' in FIG. 2D, FIG. 3A shows an enlarged cross-sectional schematic diagram of the BLM layers 20A–20C. The BLM metal layers 20 comprise a sandwich of a titanium-tungsten (TiW) layer 20A, a chromium/copper (Cr/Cu) layer 20B and a copper (Cu) layer 20C. The bottom TiW layer 20A is formed as a blanket layer covering the top surface of metallic, i.e. copper or aluminum, electrical conductor 19 and also covering the lateral surfaces 18' of connector hole 18 when the exposed ends of $SiO_2$ layer 15, $Si_3N_4$ layer 16 and polyimide layer 17 are exposed in flared opening 18' and covering the exposed surfaces of polyimide layer 17. Preferably, the TiW alloy layer 20A is deposited as a blanket film by a sputtering process. TiW layer 20A can also be deposited by sputtering or Chemical Vapor Deposition (CVD).

The chromium/copper (Cr/Cu) layer 20B is deposited upon the surface of the TiW layer 20A by sputtering.

The copper (Cu) layer 20C is deposited upon the surface of the chromium/copper (Cr/Cu) layer 20B by sputtering, by chemical vapor deposition, by electroplating, or by electroless plating.

In step 51 photoresist mask PR seen in FIG. 2D is formed over the BLM layers 20. Photoresist mask PR has an opening 21 down to the top surface of layer 20C of the BLM metal layers 20. Mask opening 21 permits deposition of a C4 lead/tin C4 solder bump 22T on the top surface of BLM layers 20 inside the mask PR at the desired location, i.e. centered above the metallic, electrical conductor 19.

In step 53, the lead/tin C4 bump 22T is deposited on the BLM metal pad 20. Preferably C4 bumps 22T are deposited, by electroplating, using the BLM layers 20 as the cathode which is connected to the metallic, electrical conductor 19, so that plating of the solder bump 22T is initiated inside the mask opening 21. Alternative methods of deposition of the solder bump 22T include evaporation and the like, as will be well understood by those skilled in the art. The solder bump 22T may be composed of from about 30 weight pct. to about 98 weight pct. lead (e.g. 97% Pb) and from about 70 weight percent to about 2 weight pct. tin (e.g. 3% Sn) including the low melting point eutectic.

Figure 2E:
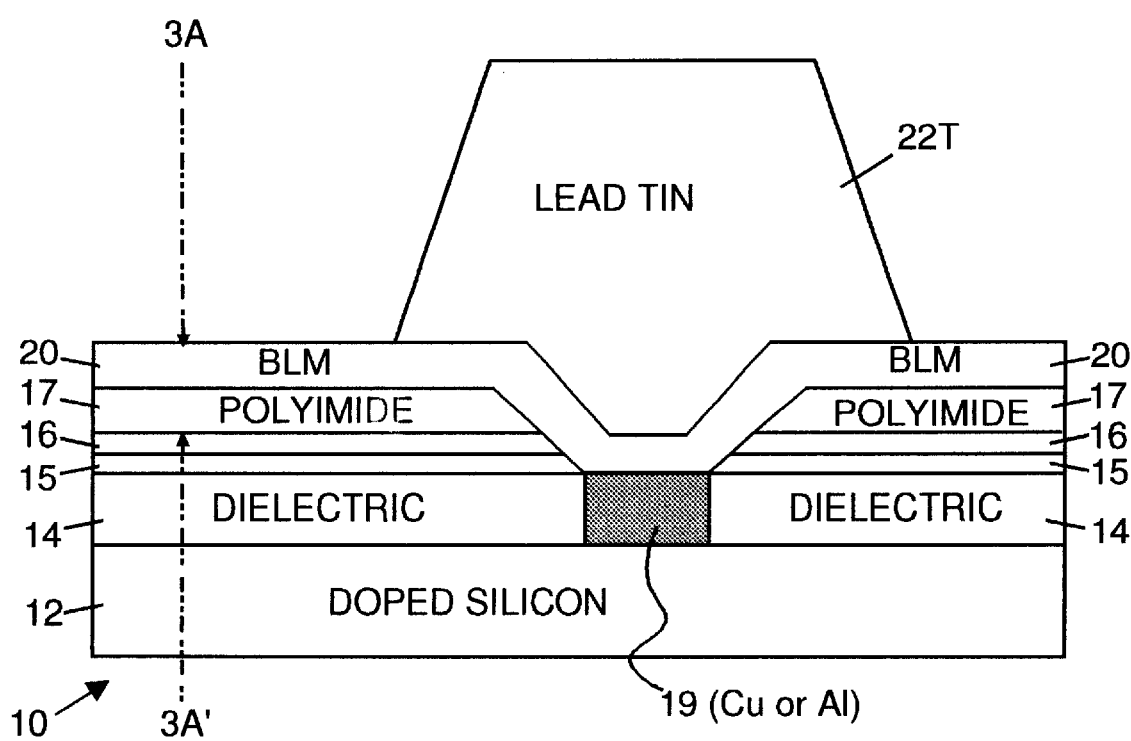

FIG. 2E shows the workpiece 10 of FIG. 2D after step 54 of removing photoresist mask PR leaving the lateral portions of the BLM layers aside from the solder bump 22T exposed, with the remainder covered by the solder bump 22T.

FIG. 3A is a section along line 3A–3A' in FIG. 2E, which shows an enlarged cross-sectional schematic diagram of the BLM layers 20.

In 2F the workpiece 10 of FIG. 2E is shown after step 55 of FIG. 1 comprising wet etchin, down through the Cu layer, Cr/Cu layer and most of TiW layer 20A (FIG. 3A) aside from the C4 lead/tin bump 22T in a self-aligned wet etching process leaving only a fractional thickness of TiW layer 20A' on the surface of polyimide layer 17 aside from the lead/tin C4 bump 22T. FIG. 3B is a section taken along line 3B–31B' in FIG. 2F, of the workpiece 10 of FIG. 3A, after the wet etching steps of FIG. 2F.

ETCHING OF COPPER LAYER AND CHROMIUM COPPER LAYER

The copper layer 20C and the chromium/copper (Cr/Cu) layer 20B are etched away first in an electroetching process described in Agarwala et al. U.S. Pat. No. 5,268,072 for "Etching Process for Avoiding Edge Stress in Semiconductor Solder Bumps". The Cu layer 20C and the Cr/Cu layer 20B are electroetched in a potassium sulfate solution using the solder bump as a mask.

TITANIUM-TUNGSTEN LAYER PARTIAL ETCHING

The TiW (titanium-tungsten) wet etching process of step 55 uses hydrogen peroxide ($H_2O_2$), water ($H_2O$), potassium sulfate ($K_2SO_4$), sulfuric acid ($H_2SO_4$), and EDTA (a salt of Ethylene Diamine Tetra Acetic acid).

TABLE I

| | |
|---|---|
| EDTA | 15 grams/liter to 40 grams/liter |
| $H_2O_2$ | 150 grams/liter to 200 grams/liter, |
| $H_2O$ | the balance of the solution |
| $K_2SO_4$ | 100 grams/liter to 200 grams/liter |
| pH | from about 3.5 to about 4.5. |

Figure 2F:
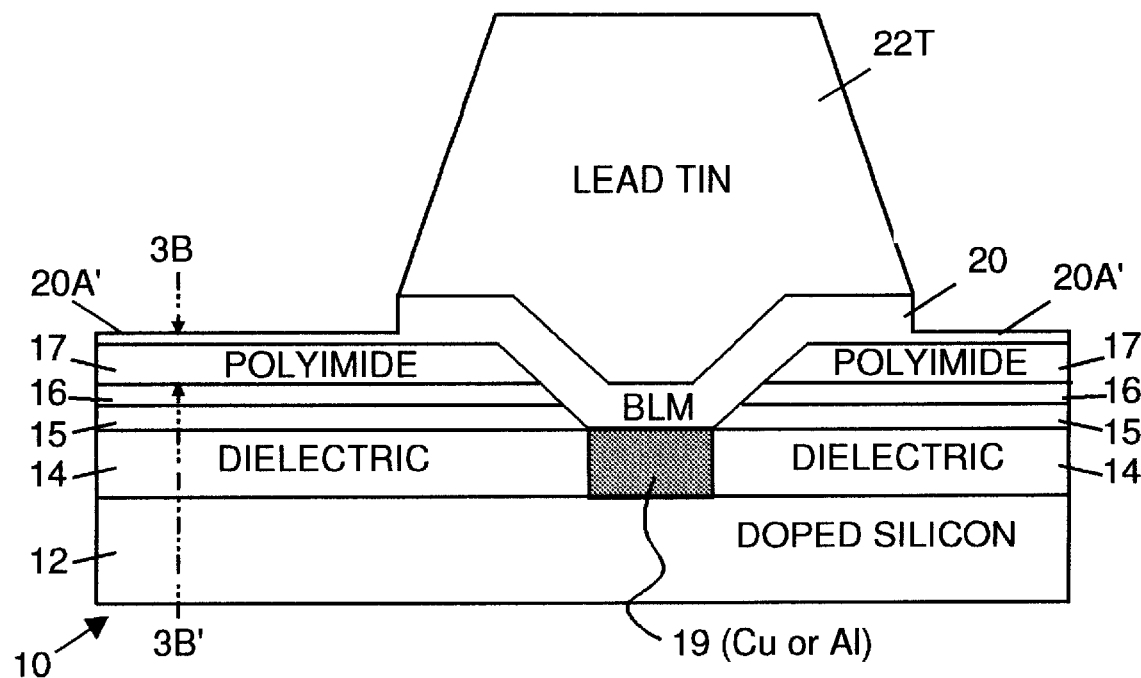
Figure 3B:
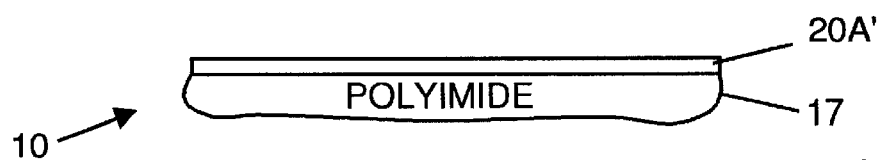
FIG. 3B is a section taken along line 3B–3B' in FIG. 2F, of the workpiece of FIG. 3A, after the wet etching steps of FIG. 2F.

This TiW etching process continues until most of the TiW layer 20A has been etched away completely leaving a residual TiW layer 20A' which is all that remains of the TiW layer 20A, as seen in FIGS. 2F and 3B.

END POINT OF TITANIUM-TUNGSTEN WET ETCHING

The way that a determination is made as to when to end the TiW wet etching step 55 is reached, is to follow the end point process of Barbee et al. U.S. Pat. Nos. 5,456,788 and 5,445,705 for "Method and Apparatus for Contactless Read-Time In-Situ Monitoring of a Chemical Etching Process", which is incorporated herein by reference, an end point method and apparatus are described. In accordance with the end point system of Barbee et al., sensors on the workpiece 10 are connected via signal lines to a monitoring unit comprising an impedance analyzer. The end point monitoring apparatus includes a base member which has a reference surface. The workpiece 10 is releasably secured to the base member substantially flush with the reference surface. There are two sensors disposed on the reference surface proximate to but not in contact with the outer perimeter of the workpiece surface. The two sensors are substantially flush with the reference surface and positioned on opposite edge portions of the workpiece surface. The end point method involves monitoring the electrical characteristics of the layer 20A' between the two sensors wherein a change in the electrical characteristic is indicative of a change in the etching process. That is to say, the electrical impedance of the TiW layer reaches a predetermined low value. At that point, a computer system or a programmable controller connected to the impedance analyzer is used to remove the workpiece from the system to stop the etching before it reaches a critical state which could lead to an undercutting of the BLM below the solder bump.

In step 57 perform a RIE process to remove the residual TiW layer 20A' in a self-aligned process. The RIE process involves use of a combination etchant gases such as sulfur hexafluoride ($SF_6$) from about 10 sccm to about 30 sccm and preferably about 15 sccm, methyl tetrafluoride ($CF_4$) from about 30 sccm to about 50 sccm and preferably about 40 sccm, argon from about 10 sccm to about 20 sccm and preferably about 15 sccm and oxygen from about 5 sccm to about 15 sccm and preferably about 10 sccm. The pressure in the chamber is from about 100 milliTorr to about 200 milliTorr, preferably about 150 milliTorr.

Preferably the etching is performed in a low density plasma system with an RF parallel plate capacitively coupled batch configuration typically known by those skilled in the art. The RF power density is in the range from about 100 Watts to about 300 Watts, preferably about 175 Watts, and the RF frequency is 13.56 MHz. A High Density Plasma System with a dual set of frequencies in the 0.4 to 200 MHz range power and biasing also works in this etching chemistry. The etcher is preferably an inductively coupled plasma etcher.

Figure 2G:
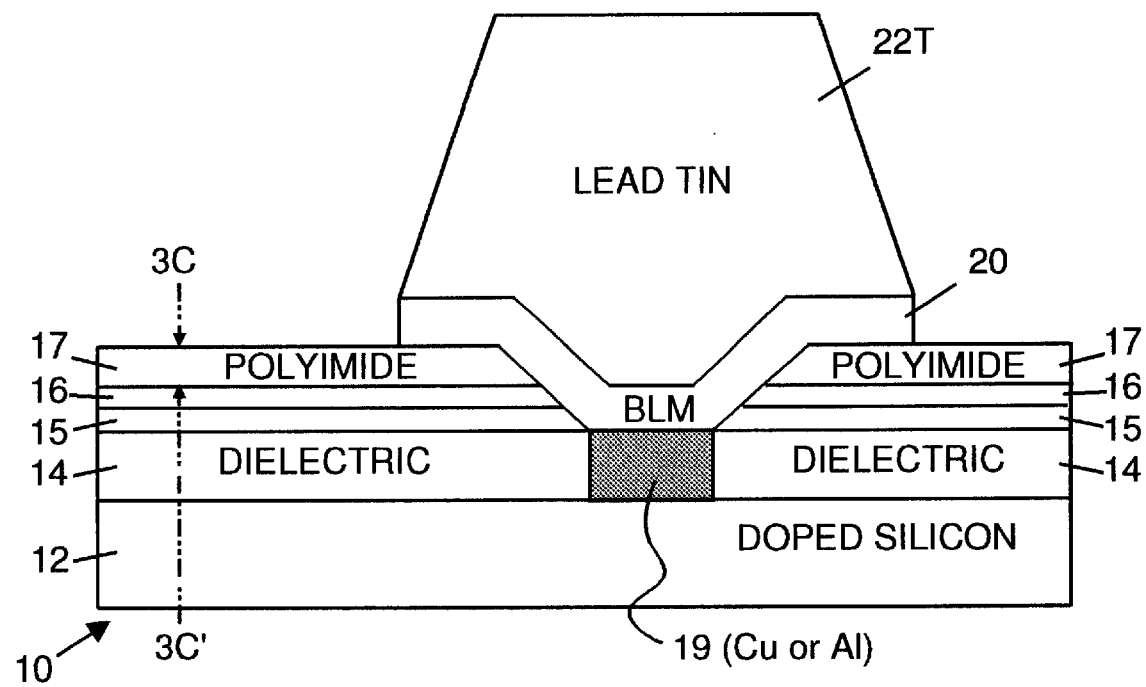

FIG. 2G shows the workpiece 10 of FIG. 2F after step 57 of RIE etching away the residual TiW layer 20A'.

Figure 3C:
FIG. 3C is a section taken along line 3C–3C' in FIG. 2G, of the workpiece of FIG. 3A, showing the workpiece after the residual TiW layer has been completely etched away, aside from the solder bump, exposing the entire surface of polyimide layer.

FIG. 3C is a section taken along line 3C–3C' in FIG. 2G, of the workpiece 10 of FIG. 3A, showing the workpiece after the residual TiW layer 20A' has been completely etched away from the surface of polyimide layer 17, aside from the solder bump 22T, exposing the entire surface of polyimide layer 17. Since the RIE process is anisotropic in nature, one would expect only a small amount of undercutting in the event of excessive etching of the TiW layer 20. In other words, if the RIE process were to continue after the condition has been reached as seen in FIG. 3C, then the RIE process will tend to cause that small level of undercutting of the TiW layer 20A, which is highly undesirable. For that reason, it is important to end the process of step 57 in a timely fashion. Referring to FIG. 1, in step 58 the method requires detecting the end point of the RIE TiW etching process, which is important in order to avoid undercutting of the layer 20A. Thus step 58 is performed to detect the end point of RIE etching of residual TiW layer 20A' aside from the lead tin bump 22T.

END POINT OF TITANIUM-TUNGSTEN RIE ETCHING

To determine when the end point to the RIE process is reached an optical system is employed to determine that all of the TiW layer 20A' has been etched away. At that point a control system or an operator terminates the etching operation by controlling a valve between the source of the etchant gases and the RIE etching chamber as suggested in an abstract of T. Tillack et al. "Monitoring of Deposition and Dry Etching of Si/SiGe Multiple Stacks" J. Vac. Sci. Technol. B, Microelectron. Nanometer Struct (USA) Vol. 14, No. 1 Jan, pp 102–105 (February 1996) A difference is that the nonselectivity of the etch process is overcome by using a 704 nm tungsten (W) lines, using optical emission spectroscopy. Alternatively titanium lines could be employed as will be well understood by those skilled in the art but detection of tungsten lines will suffice as there is ample tungsten in the layer 20A' which is being etched away.

Figure 2H:
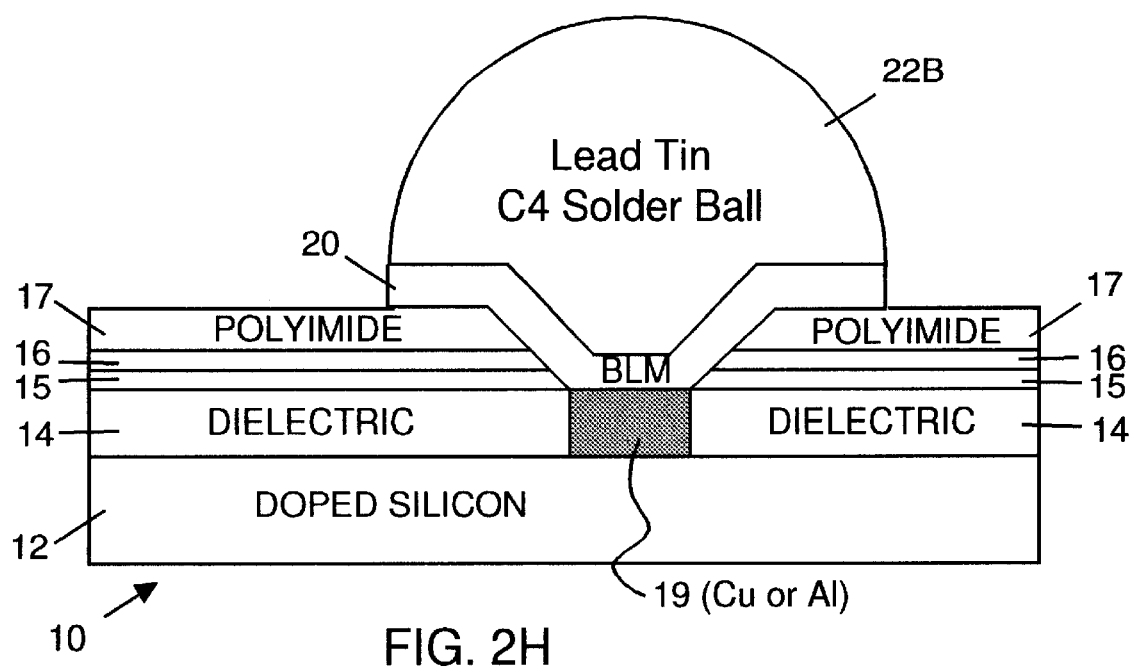

Referring to FIG. 2H, the workpiece 10 of FIG. 2G is shown after step 59 during which solder bump 22T was heated and reshaped in a reflow process to form a C4 solder ball 22B on the fully patterned BLM 20 yielding the final product of the method of this invention.

Figure 4:
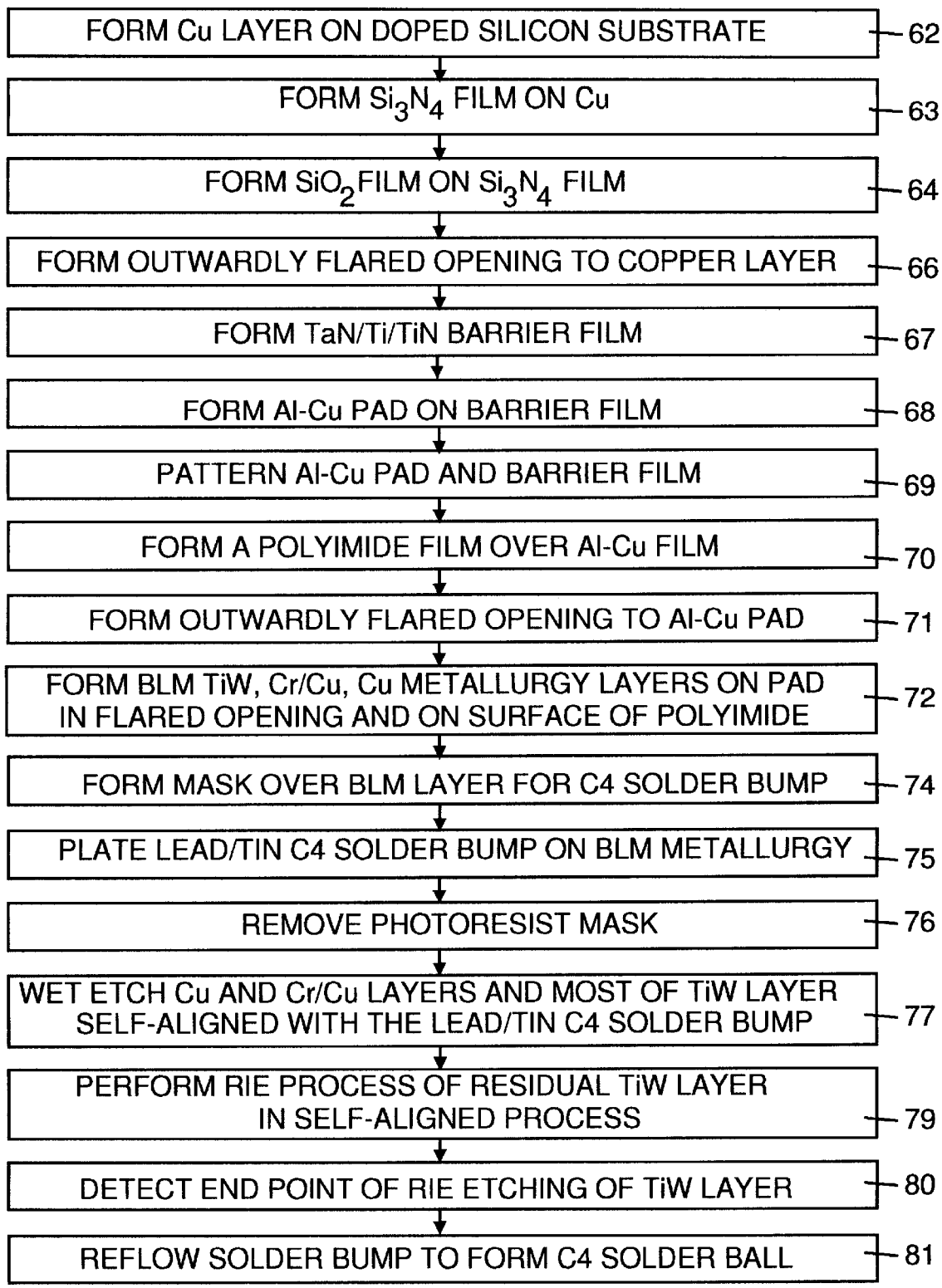
FIG. 4 is a flowchart showing forming a C4 solder ball on a BLM layer by an alternative process in accordance with the method of this invention.
Figure 5A:
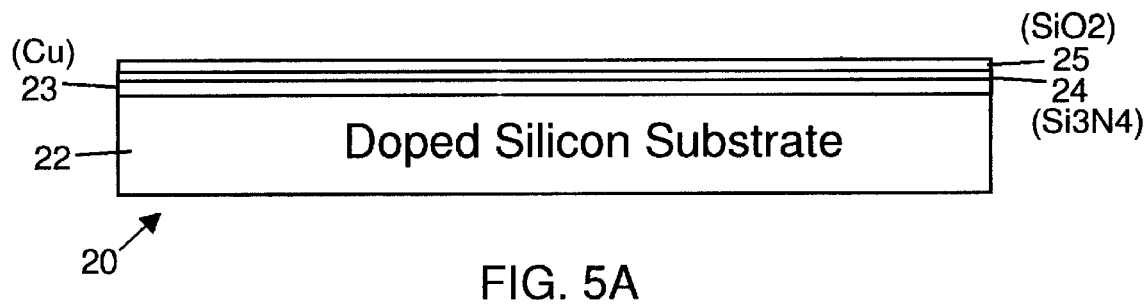
FIGS. 5A–5H are sectional views of a workpiece in the course of manufacture illustrating the process flow for the process of FIG. 4, in accordance with the method of this invention.

FIG. 4 is a flowchart showing an alternative process of forming a C4 solder ball with a BLM layer processed in accordance with the method of this invention. In the method of FIG. 4, the process steps are performed as follows:

In step 62 form Cu layer 23 on a doped silicon substrate 22 (FIG. 5A).

In step 63 form a $Si_3N_4$ film 24 on Cu layer 23 (FIG. 5A).

In step 64 form a $SiO_2$ film 25 on the $Si_3N_4$ film 24 (FIG. 5A).

Figure 5B:
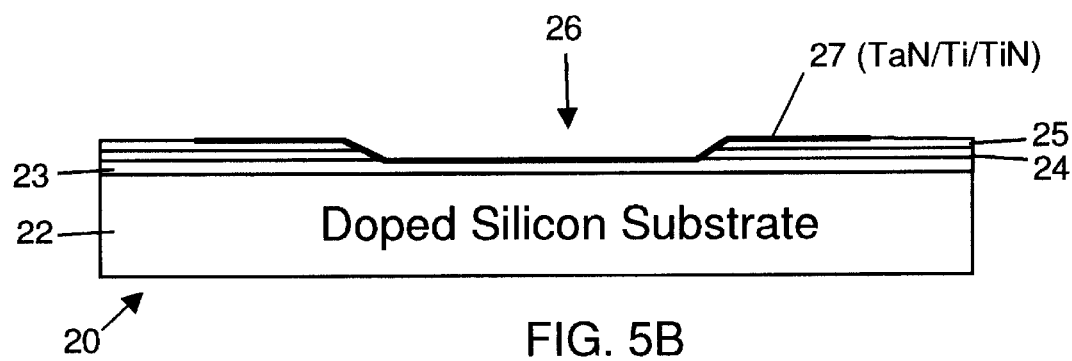

In step 66 form outwardly flared hole 26 reaching down to the top surface of copper layer 23 (FIG. 5B).

In step 67 form a blanket TaN/Ti/TiN barrier film 27 on the portion of the surface of copper layer 23 exposed at the bottom of hole 26 and on $SiO_2$ film 25 and $Si_3N_4$ film 24 (FIG. 5B).

Figure 5C:
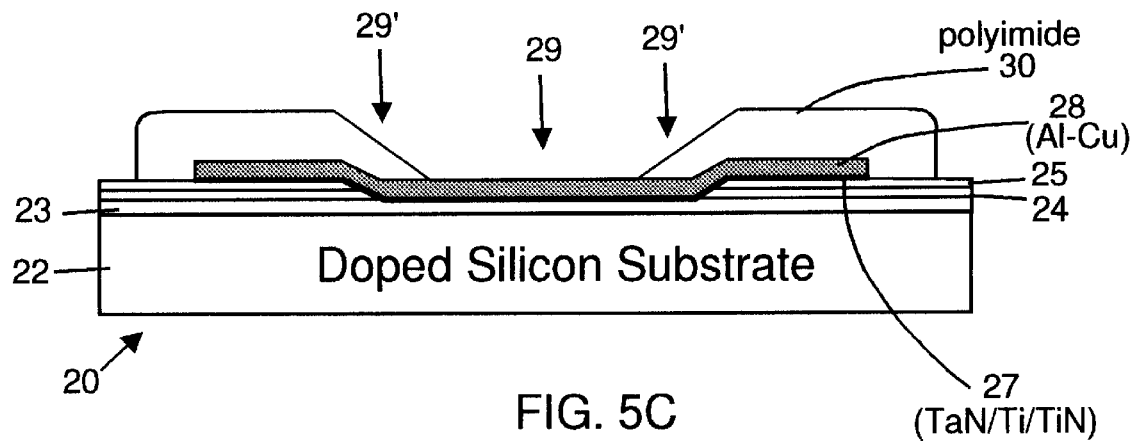

In step 68 form Al—Cu pad 28 on the barrier film 27 (FIG. 5C).

In step 69 pattern Al—Cu pad 28 and barrier film 27 (FIG. 5C), using photolithography and etching.

In step 70 form a polyimide film 30 over Al—Cu film 28 and $SiO_2$ film 25.

In step 71 form an hole 29 which is flared outwardly with flared-out (sloping) surfaces 29' of $SiO_2$ film 25 and $Si_3N_4$ film 24. The hole 29 reaches down to the top surface of Al—Cu pad 28.

Figure 5D:
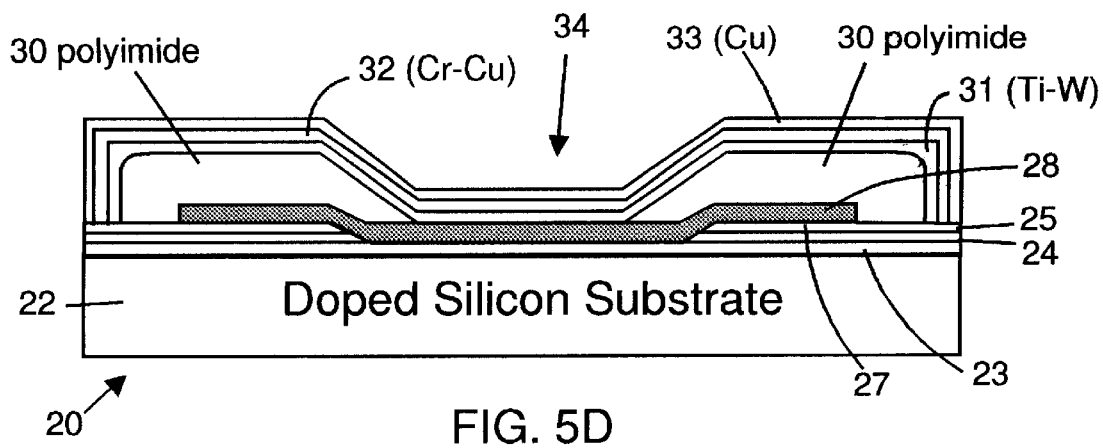

In step 72, referring to FIG. 5D, form BLM layers comprising TiW film 31, Cr/Cu film 32, Cu metallurgy film 33 on pad in flared opening and on surface of polyimide layer 30 with the BLM layers 31/32/33 reaching down into hole 29 (FIG. 5C) to contact the Al—Cu layer 28 above where layer 28 contacts the barrier layer 27 above copper layer 23 (below former hole 26 in FIG. 5B and former hole 29 in FIG. 5C). Above the hole 29 which has been partially filled by the blanket BLM layers, a new hole 34 is formed in its place.

Figure 5E:
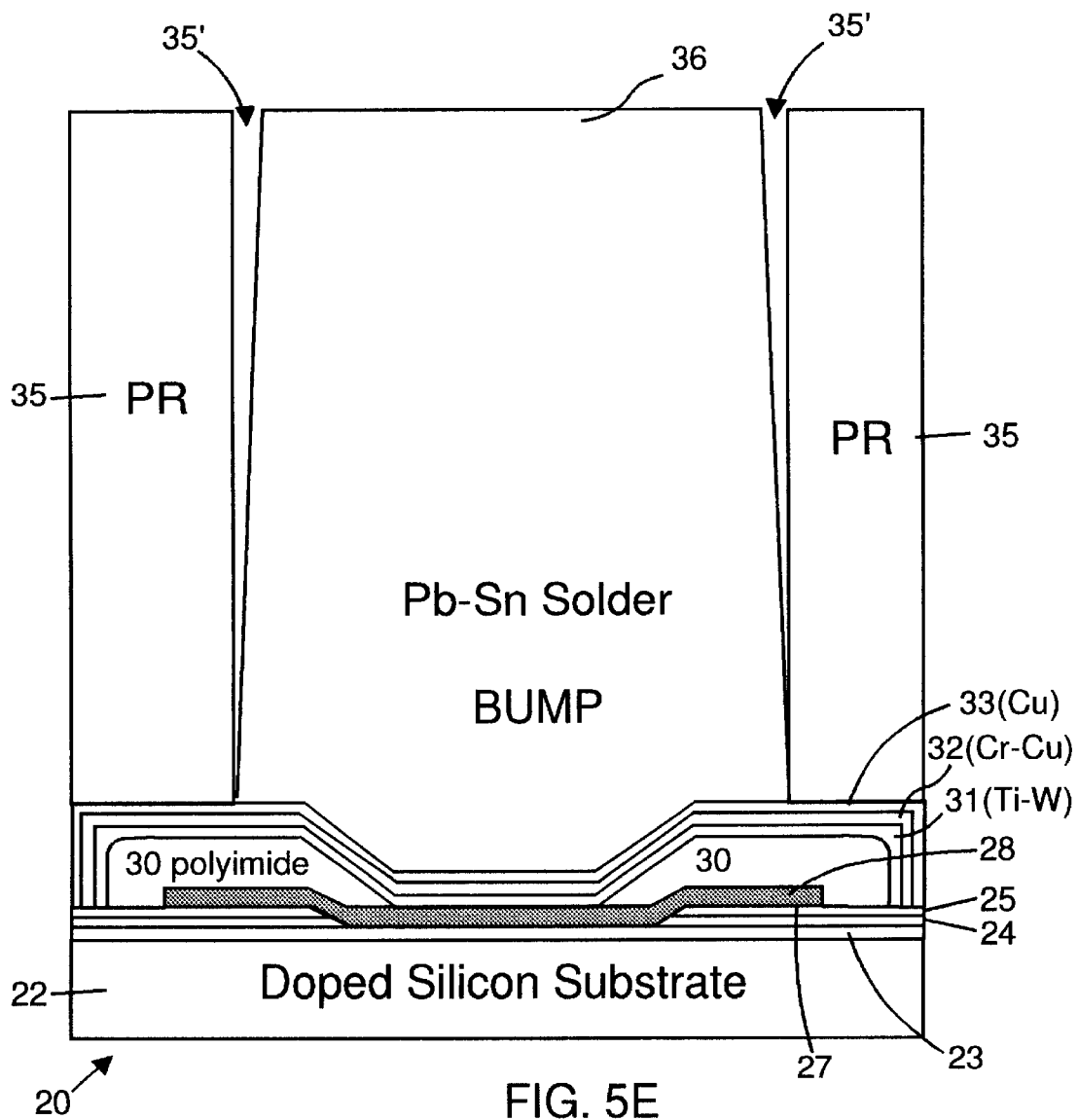

In step 74 form a photoresist mask 35 over the BLM layers 31/32/33 with an opening 35' above the hole 34 as shown in FIG. 5E.

In step 75 plate lead/tin C4 solder bump 36 over the top surface of BLM layers 31/32/33 filling the opening 35'.

In step 76 strip (remove) the photoresist mask 35.

Figure 5F:
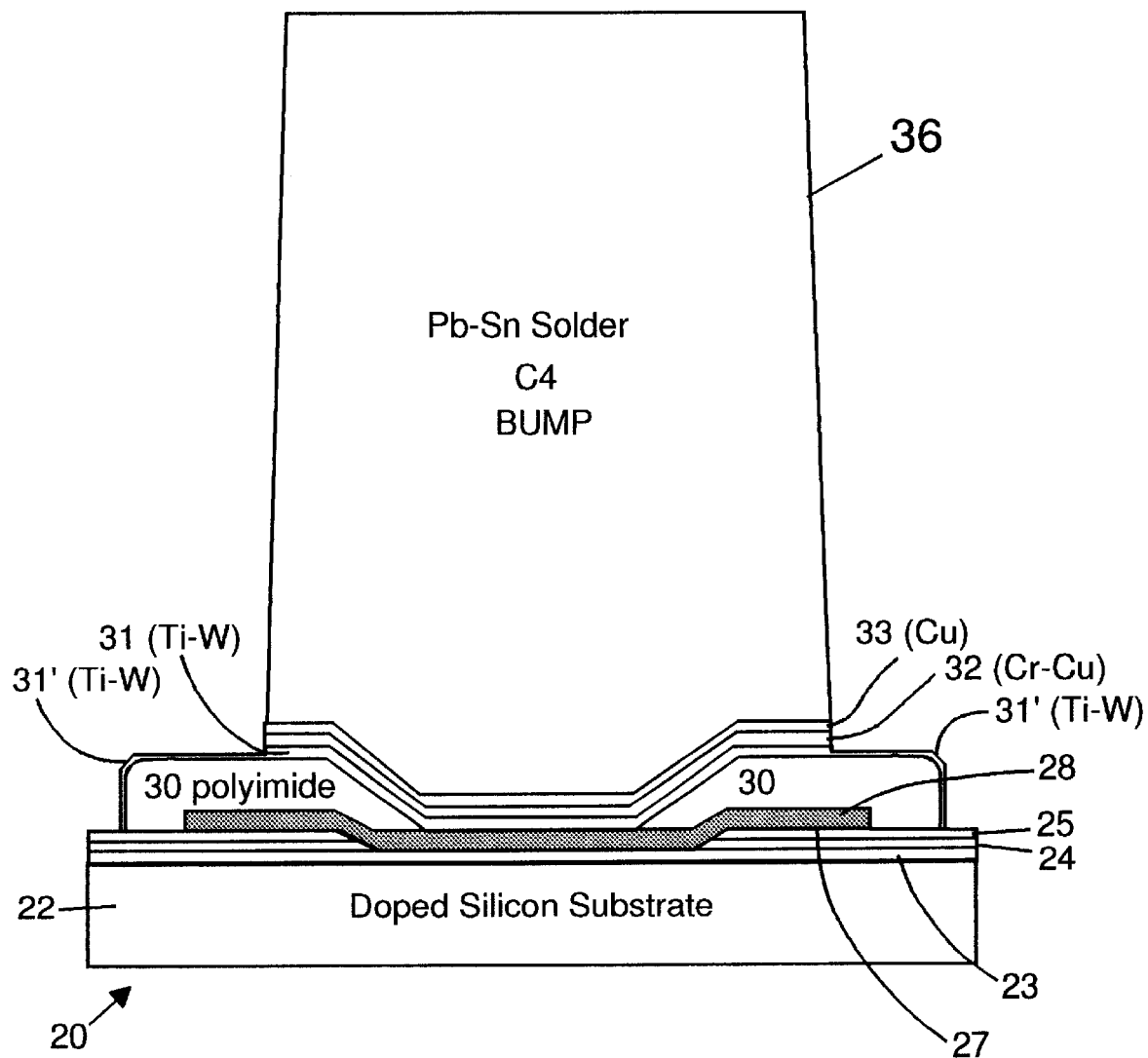

In step 77 wet etch Cu and Cr/Cu layers and most of TiW layer with the etching being self-aligned with the lead/tin C4 solder bump yielding the result shown in FIG. 5F where the TiW layer 31 has been etched down to a residual thin TiW layer 31' aside from the bump 36.

Figure 5G:
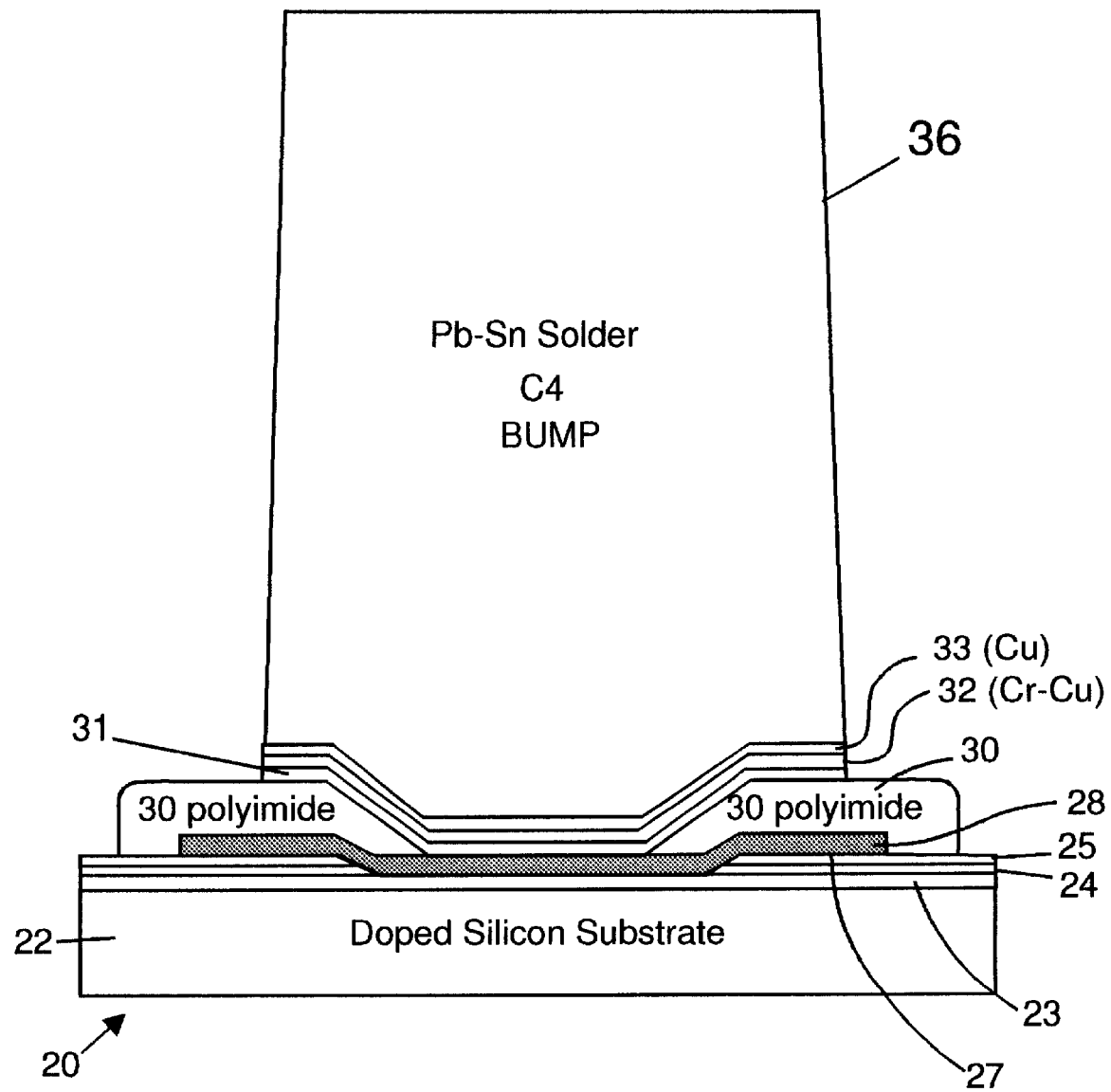
Figure 5H:
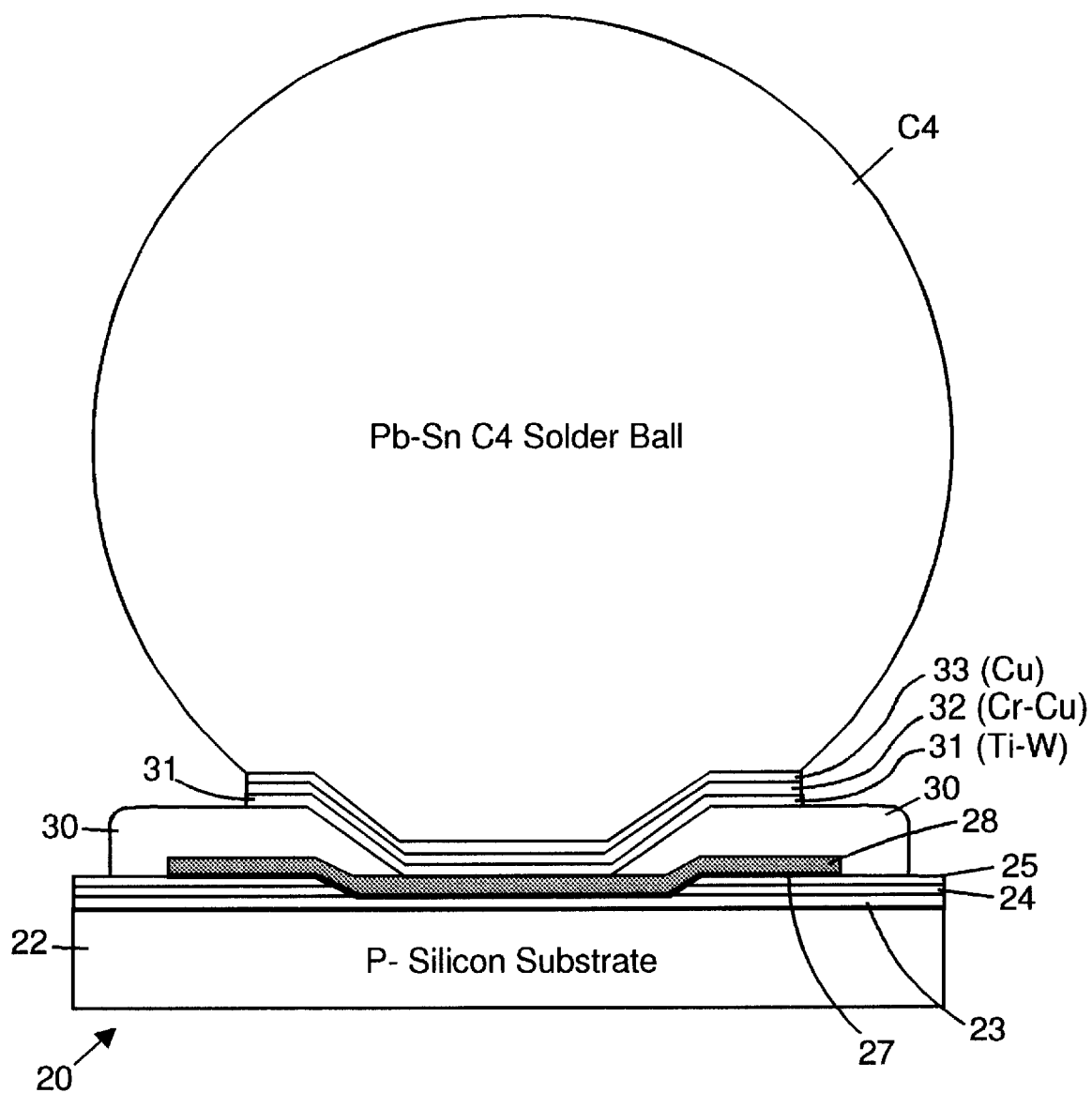

In step 79 perform RIE process of removing the residual thin TiW layer 31' in self-aligned process as shown in FIG. 5G.

In step 80 detect end point of RIE etching of TiW layer 31' as seen in FIG. 5G.

In step 81 reflow solder bump 36 to form the solder bump 36 into a C4 solder ball C4 as seen in FIG. 5H FIGS. 5A–5G show the process steps of forming a workpiece 20 in accordance with the method of FIG. 4.

Advantages of the Invention

This integrated TiW etch process is adapted for processing C4 type products with wide kerf areas.

This method has the advantages of self-alignment avoiding any additional photolithography level, and avoiding the problem of undercutting the lower level of BLM pads.

Removal of the trace residue from fuse blow alignment marks and other features in the kerf area is an additional application of the process of this invention.

This application describes a self-aligning process which does not need additional photolithography level, as indicated in the Japanese patent.

This application guarantees no-undercutting of TiW under the solder bumps.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow:

Having thus described the invention, what is claimed as new and desirable to be secured by Letters Patent is as follows:

1. A method for fabricating a solder connector on a doped semiconductor device with a metal conductor structure formed thereon surrounded by a dielectric layer comprising the following steps:

forming the dielectric layer and the metal conductor structure over the doped semiconductor substrate with the dielectric layer surrounding the metal conductor structure, forming at least one intermediate layer over the dielectric layer and the metal conductor structure, forming a hole through the intermediate layer down to the metal conductor structure, forming solder limiting metallurgy (SLM) layers, having a top surface, the SLM layers including a titanium-tungsten (TiW) layer formed over the metal conductor structure and the intermediate layer with the remainder of the SLM layers being formed over the TiW layer, forming a mask over the top surface of the SLM layers with a patterning through hole located above the metal conductor structure exposing a portion of the surface of the SLM layers, plating solder into the patterning through hole over the SLM layers and then removing the mask, wet etching away the SLM layers aside from the solder leaving a residual TiW layer over the dielectric layer, performing a dry etching process to remove the residual TiW layer aside from the solder, and detecting the final end point of etching the residual TiW layer and, then ending the dry etching when the final end point has been reached.

2. The method of claim 1 including the steps as follows:

forming a blanket silicon oxide layer over the metal conductor structure and the dielectric layer, forming a silicon nitride layer over the silicon oxide layer, forming a polyimide layer over the silicon nitride layer, and forming an opening down to the metal conductor structure.

3. The method of claim 1 wherein the solder limiting metallurgy (SLM) layers have a top surface, and the SLM layers include as follows:
   a. the titanium-tungsten (TiW) layer on the bottom,
   b. an intermediate SLM layer comprising a chromium/copper (Cr/Cu) layer, and
   c. an upper layer comprising a Cu layer.

4. The method of claim 1 including the steps as follows:
   forming a blanket silicon oxide layer over the metal conductor structure and the dielectric layer,
   forming a silicon nitride layer over the silicon oxide layer,
   forming a polyimide layer over the silicon nitride layer,
   forming an opening down to the metal conductor structure,
   the solder limiting metallurgy (SLM) layers, having a top surface, the SLM layers including the TiW layer on the bottom, an intermediate SLM layer comprising a Cr/Cu layer and an upper layer comprising a Cu layer.

5. The method of claim 1 including the solder comprising lead/tin (Pb/Sn) solder.

6. The method of claim 1 wherein the hole through the intermediate layer is tapered.

7. The method of claim 1 including the steps as follows:
   forming a blanket silicon oxide layer over the metal conductor structure and the dielectric layer,
   forming a silicon nitride layer over the silicon oxide layer,
   forming a polyimide layer over the silicon nitride layer,
   forming an opening down to the metal conductor structure,
   the solder limiting metallurgy (SLM) layers, having a top surface, the SLM layers including the TiW layer on the bottom, an intermediate SLM layer comprising a Cr/Cu layer and an upper layer comprising a Cu layer, and
   the solder comprising lead/tin (Pb/Sn) solder.

8. The method of claim 1 including the steps as follows:
   forming a blanket silicon oxide layer over the metal conductor structure and the dielectric layer,
   forming a silicon nitride layer over the silicon oxide layer,
   forming a polyimide layer over the silicon nitride layer, and
   forming an opening down to the metal conductor structure,
   the solder limiting metallurgy (SLM) layers, having a top surface, the SLM layers including the TiW layer on the bottom, an intermediate SLM layer comprising a Cr/Cu layer and an upper layer comprising a Cu layer, and the hole through the intermediate layer is tapered.

9. The method of claim 1 including the steps as follows:
   forming a blanket silicon oxide layer over the metal conductor structure and the dielectric layer,
   forming a silicon nitride layer over the silicon oxide layer,
   forming a polyimide layer over the silicon nitride layer,
   forming an opening down to the metal conductor structure,
   the solder limiting metallurgy (SLM) layers, having a top surface, the SLM layers including the TiW layer on the bottom, an intermediate SLM layer comprising a Cr/Cu layer and an upper layer comprising a Cu layer, and
   the solder comprising lead/tin (Pb/Sn) solder, and
   the hole through the intermediate layer is tapered.

10. The method of claim 1 including the step of wet etching away the SLM layers aside from the solder leaving a residual TiW layer over the dielectric layer is achieved by employing an initial step of end point detection by determining when a predetermined minimum impedance is reached.

11. The method of claim 1 including:
   the solder limiting metallurgy (SLM) layers, having a top surface, the SLM layers including the titanium-tungsten (TiW) layer on the bottom, an intermediate SLM layer comprising a chromium/copper (Cr/Cu) layer and an upper layer comprising a Cu layer,
   the step of wet etching away the chromium/copper (Cr/Cu) layer and the Cu layer layers aside from the solder leaving a residual TiW layer over the dielectric layer,
   followed the step of wet etching TiW to a predetermined thickness of TiW which is terminated by employing initial end point detection of the thickness of the TiW layer,
   followed by performing a dry etching process to remove the residual TiW layer aside from the solder, and
   then followed by ending the dry etching when a final end point has been reached.

12. A method for fabricating a solder connector on a semiconductor device comprising the following steps:
   forming at least one dielectric layer over a doped semiconductor substrate,
   forming a hole through the dielectric layer down to the semiconductor substrate,
   forming a metal conductor structure in the hole,
   forming intermediate layers over the metal conductor structure and the dielectric layer,
   forming a hole through the intermediate layer down to the metal conductor structure,
   forming Ball Limiting Metallurgy (BLM) layers, having a top surface,
   the BLM layers including a titanium-tungsten (TiW) layer formed over the metal conductor structure and the dielectric layer with the remainder of the BLM layers being formed over the TiW layer,
   forming a mask over the top surface of the BLM layers with a patterning through hole located above the metal conductor structure exposing a portion of the surface of the BLM layers,
   plating a solder bump in the patterning hole over the BLM layers, removing the mask,
   wet etching away the BLM layers aside from the solder bump leaving a residual TiW layer over the dielectric layer until an initial end point has been reached,
   performing a dry etching process to remove the residual TiW layer aside from the solder bump,
   then ending the dry etching when an end point has been reached, and heating the solder bump in a reflow process to form a solder ball.

13. The method of claim 12 including forming intermediate layers by the steps as follows:
   forming a blanket silicon oxide layer over the metal conductor structure and the dielectric layer,
   forming a silicon nitride layer over the silicon oxide layer,
   forming a polyimide layer over the silicon nitride layer, and
   forming the opening down to the metal conductor structure.

14. The method of claim 12 including as follows:
   the BLM layers, having a top surface, the BLM layers including the titanium-tungsten (TiW) layer on the bottom, an intermediate BLM layer comprising a chromium/copper (Cr/Cu) layer and an upper layer comprising a Cu layer.

15. The method of claim 12 including the steps as follows:

forming a blanket silicon oxide layer over the metal conductor structure and the dielectric layer, forming a silicon nitride layer over the silicon oxide layer, forming a polyimide layer over the silicon nitride layer, and forming an opening down to the metal conductor structure, and the BLM layers, having a top surface, the BLM layers including the TiW layer on the bottom, an intermediate BLM layer comprising a Cr/Cu layer and an upper layer comprising a Cu layer.

16. The method of claim 12 wherein the solder comprises lead/tin (Pb/Sn) solder.

17. The method of claim 12 wherein the hole through the intermediate layer is tapered.

18. The method of claim 12 including the steps as follows:

forming a blanket silicon oxide layer over the metal conductor structure and the dielectric layer, forming a silicon nitride layer over the silicon oxide layer, forming a polyimide layer over the silicon nitride layer, forming an opening down to the metal conductor structure, the solder limiting metallurgy BLM layers, having a top surface, the BLM layers including the TiW layer on the bottom, an intermediate BLM layer comprising a Cr/Cu layer and an upper layer comprising a Cu layer, and the solder comprising lead/tin (Pb/Sn) solder.

19. The method of claim 12 including the steps as follows:

forming a blanket silicon oxide layer over the metal conductor structure and the dielectric layer, forming a silicon nitride layer over the silicon oxide layer, forming a polyimide layer over the silicon nitride layer, forming an opening down to the metal conductor structure, the solder limiting metallurgy BLM layers, having a top surface, the BLM layers including the TiW layer on the bottom, an intermediate BLM layer comprising a Cr/Cu layer and an upper layer comprising a Cu layer, and the hole through the intermediate layer is tapered.

20. The method of claim 12 including the steps as follows:

forming a blanket silicon oxide layer over the metal conductor structure and the dielectric layer, forming a silicon nitride layer over the silicon oxide layer, forming a polyimide layer over the silicon nitride layer, forming an opening down to the metal conductor structure, the solder limiting metallurgy BLM layers, having a top surface, the BLM layers including the TiW layer on the bottom, an intermediate BLM layer comprising a Cr/Cu layer and an upper layer comprising a Cu layer, the solder comprising lead/tin (Pb/Sn) solder, and the hole through the intermediate layer is tapered.

21. The method of claim 12 including the step of wet etching away the BLM layers aside from the solder leaving a residual TiW layer over the dielectric layer and terminating the wet etching in response to the results of end point detection indicating that a final end point has been reached when a predetermined minimum impedance is reached.

22. A method for fabricating a solder connector on a semiconductor device comprising the following steps:

forming at least one dielectric layer over a doped semiconductor substrate, forming a hole through the dielectric layer down to the semiconductor substrate, forming a metal conductor structure in the hole, forming intermediate layers over the metal conductor structure and the dielectric layer, forming a hole through the intermediate layer down to the metal conductor structure, forming Ball Limiting Metallurgy (BLM) layers, having a top surface, the BLM layers including a titanium-tungsten (TiW) layer formed over the metal conductor structure and the dielectric layer with the remainder of the BLM layers being formed over the TiW layer comprising an intermediate BLM layer comprising a chromium/copper (Cr/Cu) layer and an upper BLM layer comprising a Cu layer, the ball limiting metallurgy (BLM) layers, having a top surface, forming a mask over the top surface of the BLM layers with a patterning through hole located above the metal conductor structure exposing a portion of the surface of the BLM layers, plating a solder bump in the patterning hole over the BLM layers, removing the mask, wet etching away the BLM layers aside from the solder bump leaving a residual TiW layer over the dielectric layer, performing the step of wet etching away the chromium/copper (Cr/Cu) layer and the Cu layer layers aside from the solder in a potassium sulfate solution leaving a residual TiW layer over the dielectric layer, then performing the step of wet etching TiW in a wet etching solution of hydrogen peroxide ($H_2O_2$), water ($H_2O$), potassium sulfate ($K_2SO_4$), sulfuric acid ($H_2SO_4$), and EDTA (a salt of EthyleneDiamineTetraAcetic acid) continuing until only a predetermined thickness of TiW remains, at which time the wet etching of TiW is terminated by employing initial end point detection of the residual thickness of the TiW layer, followed by performing a dry etching process to remove the residual TiW layer aside from the solder bump, and then ending the dry etching when an end point has been reached, and heating the solder bump in a reflow process to form a solder ball.

23. A method for fabricating a solder connector on a semiconductor device comprising the following steps:

forming at least one dielectric layer over a doped semiconductor substrate, forming a hole through the dielectric layer down to the semiconductor substrate, forming a metal conductor structure in the hole, forming intermediate layers over the metal conductor structure and the dielectric layer, forming a hole through the intermediate layer down to the metal conductor structure, forming Ball Limiting Metallurgy (BLM) layers, having a top surface, the BLM layers including a titanium-tungsten (TiW) layer formed over the metal conductor structure and the dielectric layer with the remainder of the BLM layers being formed over the TiW layer comprising an intermediate BLM layer comprising a chromium/copper (Cr/Cu) layer and an upper BLM layer comprising a Cu layer, the ball limiting metallurgy (BLM) layers, having a top surface, forming a mask over the top surface of the BLM layers with a patterning through hole located above the metal conductor structure exposing a portion of the surface of the BLM layers, plating a solder bump in the patterning hole over the BLM layers, removing the mask, wet etching away the BLM layers aside from the solder bump leaving a residual TiW layer over the dielectric layer, performing the step of wet etching away the chromium/copper (Cr/Cu) layer and the Cu layer layers aside from the solder in a potassium sulfate solution leaving a residual TiW layer over the dielectric layer, then performing the step of wet etching TiW in a wet etching solution of hydrogen peroxide ($H_2O_2$), water ($H_2O$), potassium sulfate ($K_2SO_4$), sulfuric acid ($H_2SO_4$), and EDTA (a salt of EthyleneDiamineTetraAcetic acid) continuing until only a predetermined thickness of TiW remains, at which time the wet etching of TiW is terminated by employing end point detection of the thickness of the TiW layer, followed by performing a dry etching process to remove the residual TiW layer aside from the solder bump, then ending the dry etching when an end point has been reached, heating the solder bump in a reflow process to form a solder ball, determining when the end point of wet etching of the TiW layer is reached by monitoring the electrical impedance of the TiW layer until a predetermined minimum impedance is reached, and employing optical detection to determine when all of the TiW layer has been etched away and then terminating the etching operation by controlling a valve between the source of the etchant gases and the workpiece.

* * * * *